United States Patent
Boerstler et al.

(10) Patent No.: US 7,113,881 B2
(45) Date of Patent: Sep. 26, 2006

(54) METHOD AND APPARATUS FOR SEMI-AUTOMATIC EXTRACTION AND MONITORING OF DIODE IDEALITY IN A MANUFACTURING ENVIRONMENT

(75) Inventors: David W. Boerstler, Round Rock, TX (US); Eskinder Hailu, Austin, TX (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 146 days.

(21) Appl. No.: 10/981,157

(22) Filed: Nov. 4, 2004

(65) Prior Publication Data
US 2006/0107242 A1    May 18, 2006

(51) Int. Cl.
*G01R 27/28* (2006.01)
*G01R 31/26* (2006.01)

(52) U.S. Cl. .................. 702/117; 702/130; 438/17; 438/18; 257/E21.002; 257/E21.053

(58) Field of Classification Search ................. 702/117, 702/130; 438/14, 17, 18; 257/E21.002, 257/E21.041, E21.053
See application file for complete search history.

(56) References Cited

U.S. PATENT DOCUMENTS

2004/0159904 A1* 8/2004 Clabes et al. ............... 257/467

* cited by examiner

*Primary Examiner*—Bryan Bui
*Assistant Examiner*—Meagan S Walling
(74) *Attorney, Agent, or Firm*—Stephen J. Walder, Jr.; Diana R. Gerhardt; Robert M. Carwell

(57) ABSTRACT

A method, an apparatus, and a computer program are provided for the semi-automatic extraction of an ideality factor of a diode. Traditionally, current/voltage curves for diodes, which provided a basis for extrapolating the ideality factors, had to be determined by hand. By employing a thermal voltage proportional to absolute temperature (PTAT) generator in conjunction with an extraction mechanism, the ideality factor can be extracted in an semi-automatic manner. Therefore, a reliable, quick, and less expensive device can be employed to improve measurements of ideality factors.

21 Claims, 6 Drawing Sheets

METHOD AND APPARATUS FOR SEMI-AUTOMATIC EXTRACTION AND MONITORING OF DIODE IDEALITY IN A MANUFACTURING ENVIRONMENT

FIELD OF THE INVENTION

The present invention relates generally to diode manufacturing, and more particularly, to testing manufactured diodes to determine ideality factors.

DESCRIPTION OF THE RELATED ART

Diodes are non-linear components that have been utilized for a number of years for various devices and applications. For example, bandgap reference circuits, thermal sensor circuits, and current reference circuits employ precision diodes for devices like microprocessors, Digital Signal Processors (DSP), and Analog-to-Digital Converters (ADC). Within such application the forward bias characteristics are important.

While manufacturing diodes within such devices, however, certain characteristics are measured to assist in understanding the forward characteristics of the diodes. Of these factors, one of the more important is the ideality factor. Specifically, the forward bias characteristics are modeled by a current/voltage relationship, which is as follows:

$$I = I_s e^{V/nkT}, \text{ or} \quad (1)$$

$$V = nkT * \ln(I/I_s) \quad (2)$$

$I_s$ is the reverse bias saturation current of the diode, and n is the ideality factor. T is the absolute temperature, and the measurement is made at room temperature, which is usually on the order of 297 K. Boltzmann's constant is k ($k=1.38*10^{-23}$ J/K). Hence, kT is typically on the order of 26 mV for room temperature.

For many applications, the ideality factor is closely monitored because variations in the ideality factor can induce errors. Making such precision diodes, though, can be difficult, especially in microprocessor fabrication. For example, in many cases the 3 sigma ideality factor variation can be as high as 2%. Such a large variation, however, is not acceptable for precision applications. Some reasons for the associated difficulties are that the diode fabrication processes are designed to be compatible with Complementary Metal Oxide Semiconductor (CMOS) processes to reduce costs.

Additionally, if the precision diodes are manufactured with Silicon on Insulator (SOI) processes, the manufacture of diodes becomes more difficult. SOI based diodes are usually lateral diodes because lateral diodes are typically the only feasible solution. However, many other contributory factors are added to ideality factor variation in SOI processes, such as silicon layer thickness, surface defects, and doping fluctuations.

To complicated the situation, calculation of the ideality factor of a diode has been an intensive process. To calculate the ideality factors of diodes, the I/V curves of the diodes are measured. Then, curve fitting techniques are applied to the I/V curves determine the ideality factors. The I/V curve process, however, is a manual process and is time consuming. Therefore, there is a need for a method and/or apparatus for determining the ideality factors of diodes that addresses at least some of the problems associated with the conventional processes.

SUMMARY OF THE INVENTION

The present invention provides a method, an apparatus, and a computer program for semi-automatic extraction and monitoring of diode ideality in a manufacturing environment. To determine ideality factors of a diode, a thermal voltage output proportional to temperature (PTAT) are determined by a PTAT generator. An extraction control unit driven by a clock control block then allows for a multiplexer (mux) to receive thermal voltage output and a signal corresponding to said extraction control output. Then based on the output of the mux, a comparator compares the output from the mux to an ideal PTAT value to determine whether the mux output is higher or lower than the ideal PTAT value. A serial shift register then stores to the comparator output.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
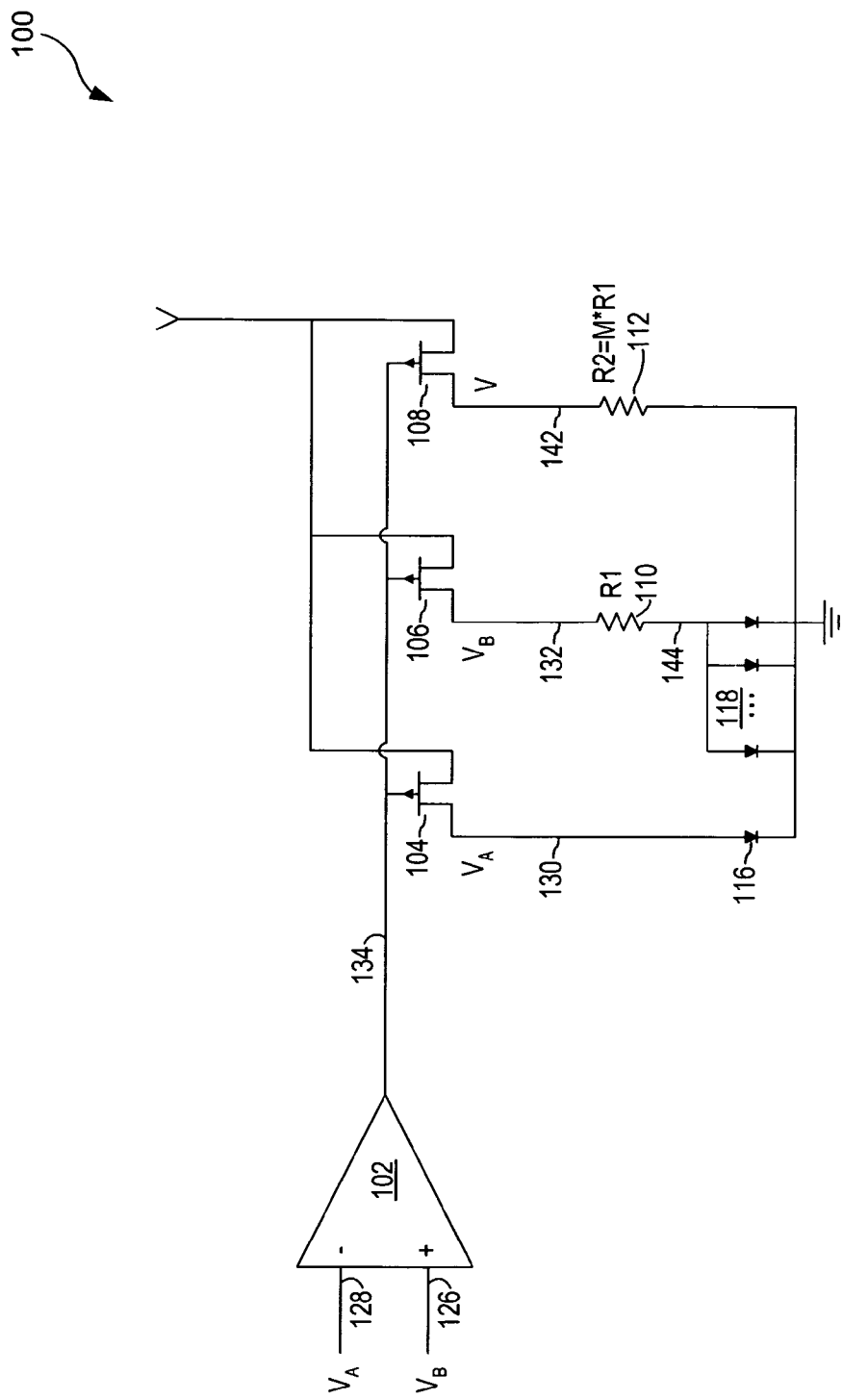
FIG. 1 is a block diagram depicting a conventional thermal voltage proportional to absolute temperature (PTAT) generator.

Referring to FIG. 1 of the drawings, the reference numeral 100 generally designates a PTAT generator. The PTAT generator 100 comprises a comparator 102, a Positive-channel Metal Oxide Semiconductor Field Effect Transistors (PMOSs) 104, 106, and 108, a first diode 116, a plurality of second diodes 118, and a resistors 110 and 112.

The purpose of the PTAT generator 100 is to measure thermal voltages. To the first order, an ideality factor of a diode is temperature independent. The PTAT can be obtained by the voltage difference between two forward biased diodes with different current densities, which is defined as follows:

$$PTAT = \Delta V = nkT^* \ln(N), \quad (3)$$

where N is the current density ratio of the two diodes.

To determine this PTAT voltage, the low-voltage PTAT generator outputs a voltage that is related to the PTAT voltage. Two voltages ($V_a$ and $V_b$) are input into the comparator 102 through a communication channel 128 and a communication channel 126, respectively. The comparator 102 then outputs a voltage across a communication channel 134, which is connected to the gates of the PMOSs 104, 106, and 108.

The interrelationships of voltages at the sources of each of PMOSs 104, 106, and 108 are indicative of the ideality factor. The first voltage ($V_a$) is voltage at the drain of the PMOS 104 that is coupled to a communication channel 130. The second voltage ($V_b$) is the voltage at the drain of the PMOS 106 that is coupled to a communication channel 132, and a voltage ($V_{out}$) is the voltage at the drain of the PMOS 108 that is coupled to a communication channel 142.

Achievement of the voltages is accomplished through the connection of various components to the individual gates of the PMOSs 104, 106, and 108. The anode of the first diode 116 is connected to the communication channel 130, while the cathode of the first diode 116 is coupled to ground. The resistor 110, having a value of $R_1$, is coupled to the communication channel 132 and to the anodes of the second diodes 118 at a communication channel 144. The cathodes of the second diodes 118 are then coupled to ground. The second resistor 112 is then coupled to the communication channel 142 and ground. The value of the second resistor 112 is $R_2$. The value of the resistor 112 is defined by the following equation:

$$R_2 = m^* R_1, \text{ where m, N.} \quad (4)$$

Based on all of the values of the voltages and components, the PTAT voltage can be determined. The PTAT voltage is equal to the voltage ($V_{out}$) at the communication channel 142 for an ideal diode. The value of the voltage ($V_{out}$) is as follows if the size of the PMOSs 104, 106, and 108 are the same:

$$V_{out} = mnkT^* \ln(N) = (R_2/R_1)^* nkT^* \ln(N). \quad (5)$$

Because of the offset effects of the operation amplifier, N, the current ratio density ratio of the diodes, should be greater than 10. Also, the resistors can be scaled up or scaled down for power control and other purposes.

Figure 2:
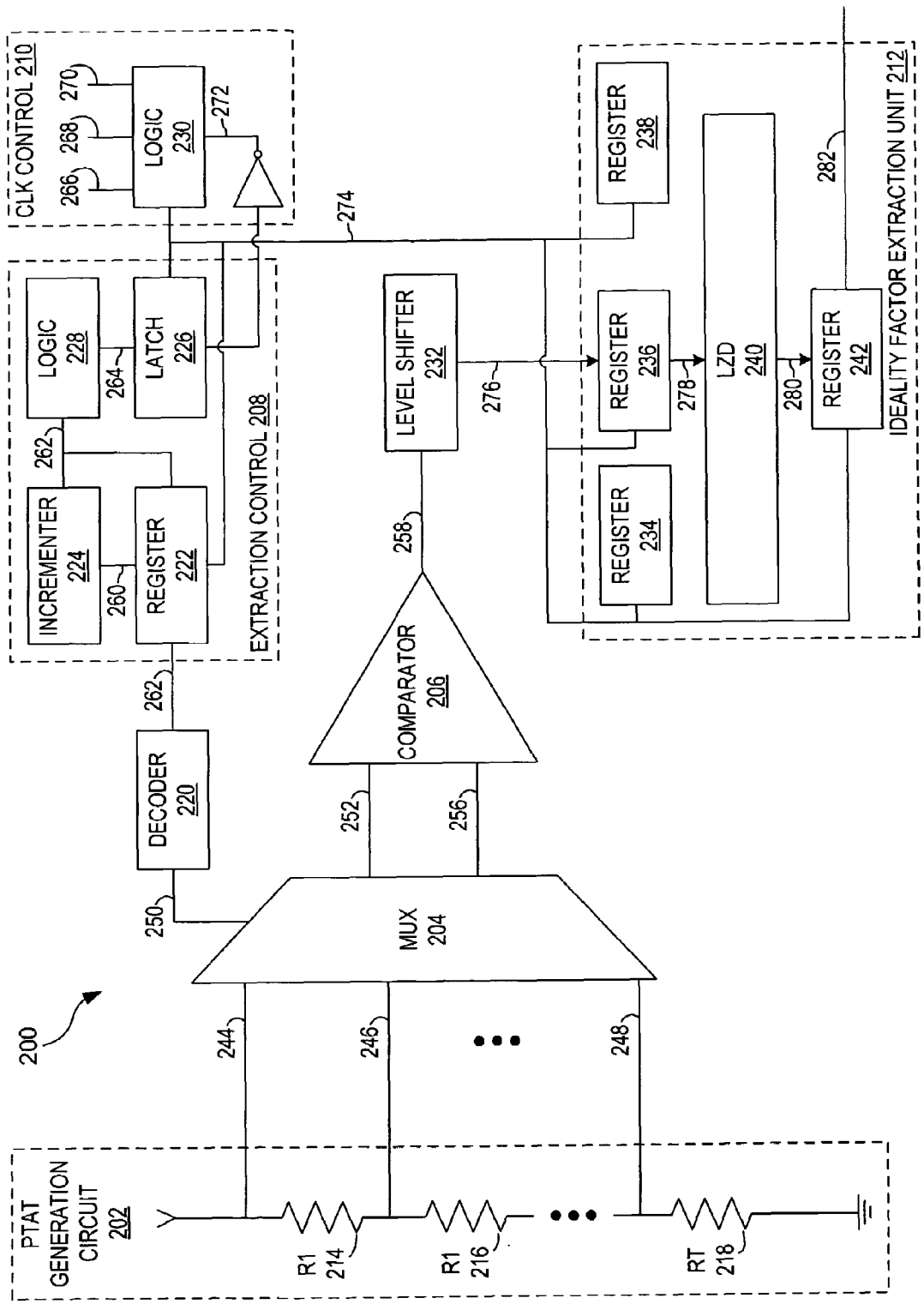
FIG. 2 is a block diagram depicting the ideality factor extraction circuitry.
Figure 3:
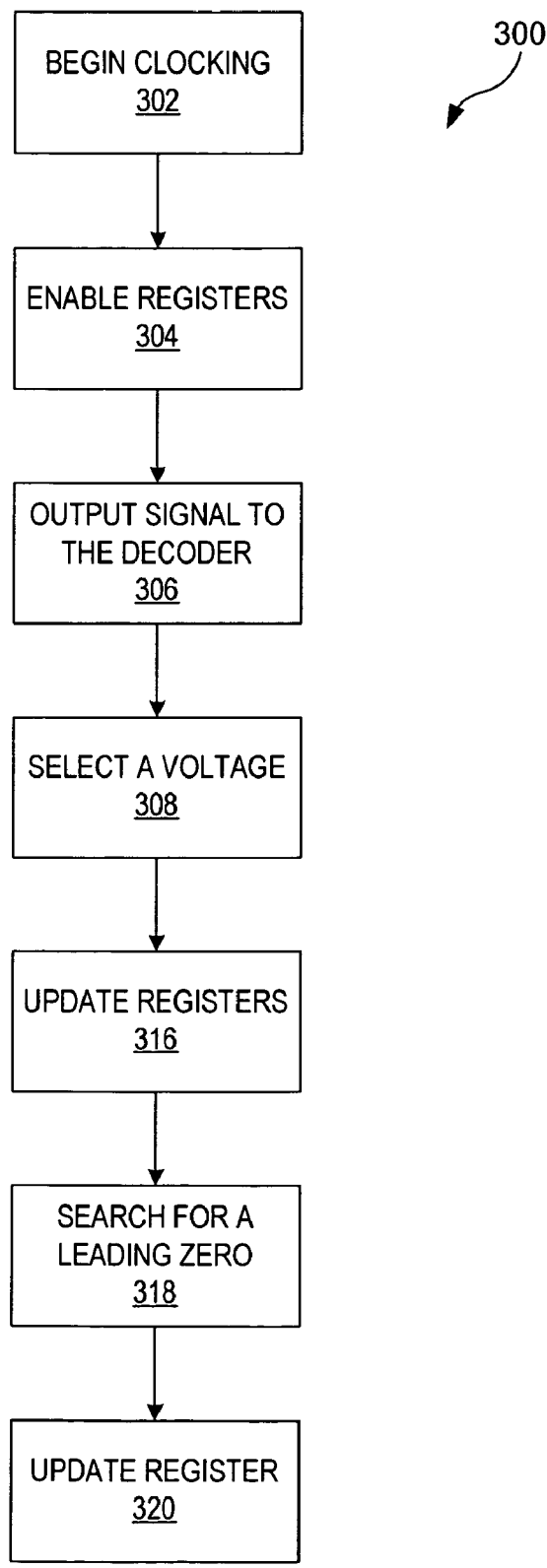
FIG. 3 is a flowchart depicting the operation of the ideality factor extraction circuitry of FIG. 2.

To then measure the ideality factors of the second diodes 118 automatically, additional circuitry is employed to make the measurements. Referring to FIGS. 2 and 3 of the drawings, the reference numeral 200 and 300 generally designates ideality factor extraction circuitry and the method of operation of the ideality factor extraction circuitry. The extraction circuitry comprises PTAT generation circuitry 202, a multiplexer (mux) 204, a decoder 220, a comparator 206, a level shifter 232, extraction control circuitry 208, clock control circuitry 210, and an extraction unit 212.

The PTAT generation circuitry 202 is the same circuitry as the PTAT generation circuitry 100 of FIG. 1. However, the voltage divider that comprises the second resistor 112 of FIG. 1 is depicted for the purposes of illustration. Hence, the PTAT generation circuitry 202 comprises a resistor 214, with a value of $R_1$, a resistor 216, with a value of $R_1$, and a third resistor 218, with a value of $R_t$. Typically, sixteen resistors are employed within the voltage divider, but three are shown for the purposes of illustration. However, there can be as many resistors as desired depending on the use. Also, the resistors can be scaled up or scaled down for power control and other purposes.

Each of the voltages from the voltage divider of the PTAT generator 202 is then utilized for measurement. Voltages from the PTAT generator 202 are transmitted to the mux 204 through communication channels 244, 246, and 248; however, there are as many communication channels as voltage divisions in the voltage divider. The mux 204 then communicates a selected output voltage to the comparator 206 through a communication channel 252. The selection of an output voltage is provided by a decoder 220 through a communication channel 250.

Producing the select signal for the mux, though, involves timing control. Logic 230 provides a clock extraction signal to the extraction control circuit 208 through a communication channel 274. The logic 230 receives a clock signal via communication channel 266, an extraction enable signal via communication channel 268, a miscellaneous control signal via communication channel 270, and an inverted feedback signal from the extraction control circuitry 208 via communication channel 272 in step 302. Once the enable signal is provided to the extraction control circuitry 208, the latch 226 and the register 222 are enabled in step 304. The register 222 then outputs a signal to decoder 220 and to the incrementer 224 and the logic 228 through a communication channel 262 in step 306. The incrementer 224 increments the value and outputs the value to register 222 through a communication channel 260. The logic 228 will then produce a high signal when the extraction operation is completed. The logic 228 forwards its value to the one-bit latch 226 through a communication channel 264. The inverted output of the latch 226 is then fed back to the clock control circuit 210 as the extraction complete signal. The completion signal does not occur, however, until completion of the cycle through the voltage divider chain.

Essentially, the extraction control circuit 208 and the clock control circuit 210 cycle through a fixed number of cycles. Once clocked and enabled, the logic 230 enables the extraction control circuit 208. The register 222 has a length that corresponds to the number of voltage measurements input into the mux 204. When the extraction circuit 208 becomes enabled, the first bit in register 222 is '1,' and the remaining bits are '0.' Each time the register 222 outputs a signal to the decoder 220, the values stored are also incremented by 1 in preparation for the next cycle. When all of the bits of the register 222 becomes '1,' the logic 228 generates a logic high, or '1,' that is transmitted to the latch 226. The inverted signal latch 226 then deactivates the clock control circuit 210, signifying the completion of the extraction.

Based on the output of the decoder 220, the mux then can cycle through the voltages provided by the PTAT generator 202 in step 308. Each voltage is then provided to the comparator 206 at the communication channel 252. Each of the voltages along the voltage divider of the PTAT generator 202, are then compared to a voltage input to the comparator 206 at an communication channel 256. The voltage input to the comparator 206 at the communication channel 256 correlates to an ideal voltage that is known and produced by a precision voltage source (not shown). The ideal voltage is chosen based on the number of voltage divisions and the chosen current density ratio. The comparator 206 compares the two input voltages, outputting a signal to the level shifter 232 at a communication channel 258. The use of a level shifter 232 is optional, however, because the level shifter 232 converts an analog signal to the proper digital signal level. The combination of the level shifter 232 and the comparator 206 determined if the measured voltage along the voltage divider chain is greater than the ideal voltage and outputs a level shifted signal. The level shifted signal is input into the extraction unit 212 through a thirteenth communication channel 276.

The extraction unit 212 then serves to store the related measurements. Serial registers 234, 236, and 238, a Lead Zero Determining circuit (LZD) 240, and a register 242 comprise the extraction unit 212. For each voltage input into the mux there is a corresponding serial register. Each of the serial registers 234, 236, 238, and 242 receive the clock extraction signal through the communication channel 274. Whenever the voltage from the voltage divider is greater than the ideal voltage, a '1' is input into the corresponding serial register and a '0' if the voltage is less than ideal voltage in step 316. Based on the values of the serial registers transmitted through a communication channel 278 to the LZD 240, the LZD 240 determines the register at which there is a transition of the voltage from the voltage divider being greater than the ideal voltage to being less than the ideal voltage in step 318. The LZD 240 then communicates the determination to the register 242 through a communication channel 280 to update the register 242 in step 320. The register 242 then can output the final selection through the communication channel 282. The final selection signal is a mux select signal, though, and not a voltage; however, a voltage can be extrapolated from the final select signal.

The significance of the final selection is that it is determinative of the ideality factor. The final selection corresponds to a voltage along the voltage divider chain of the PTAT generator 202 such that the ideality factor can be calculated. More particularly, the ideality factor of the diodes can be determined from the voltages, which is as follows:

$$n = V_R/V_m, \quad (6)$$

where $V_m$ is the final selection voltage.

Figure 4:
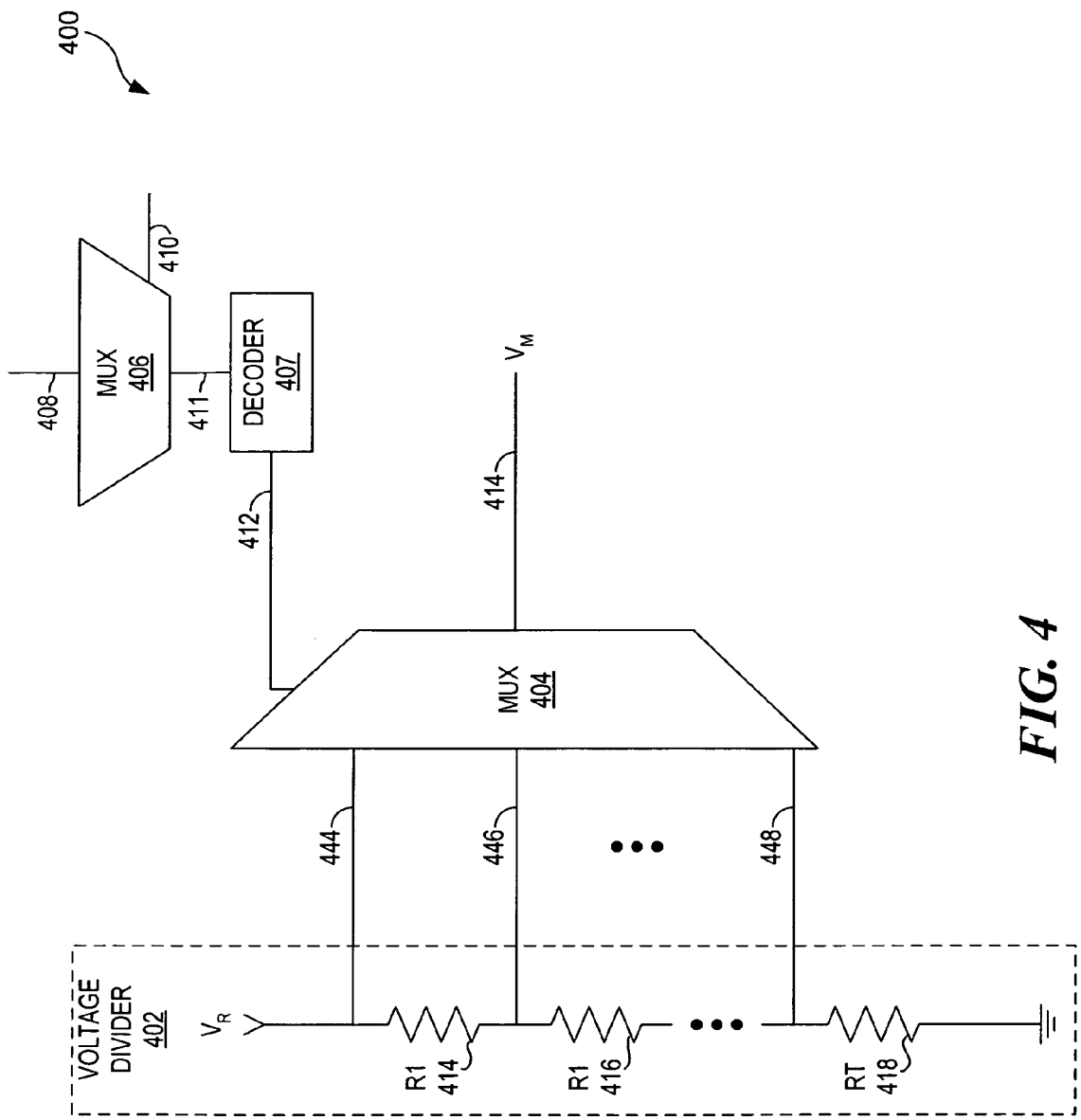
FIG. 4 is a block diagram depicting a converter circuit.
Figure 6:
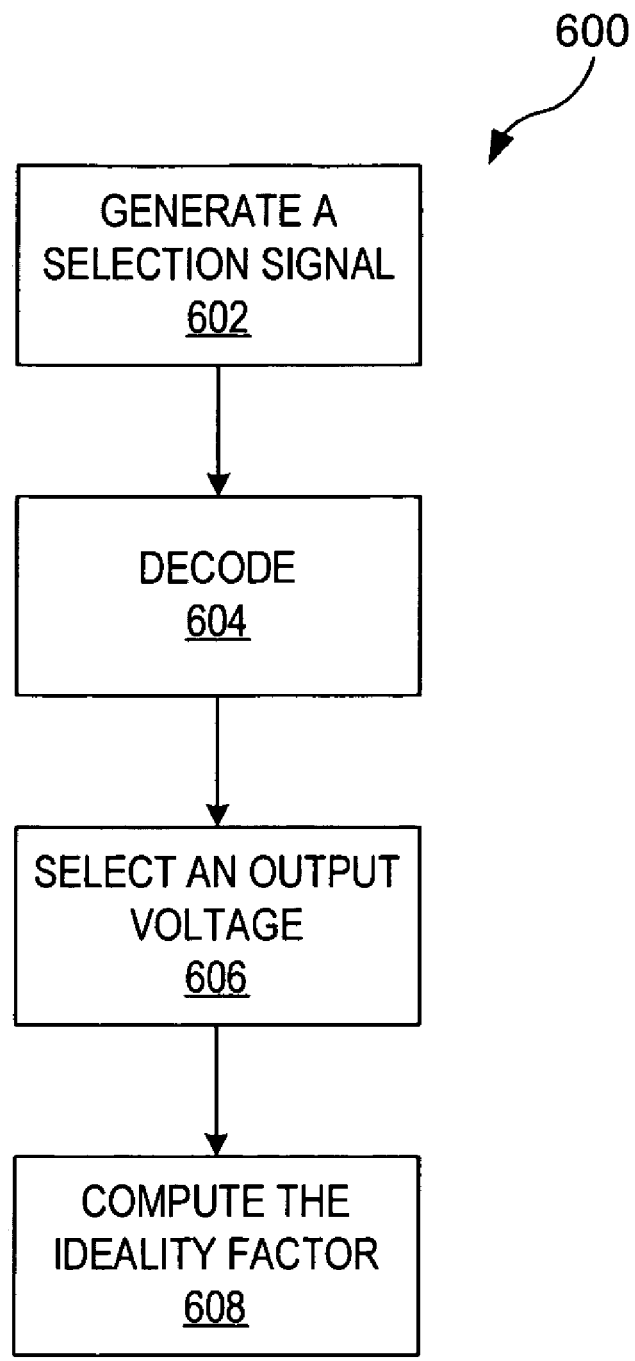
FIG. 6 is a flow chart depicting the operation of the converter circuitry of FIGS. 4 and 5.

The ideality factor extraction circuitry 200 can also be utilized in multiple locations on a wafer to determine ideality factors for a number of diodes. As noted on the PTAT generator 100, there are multiple second diodes 118. However, to be able to measure ideality factors, converter circuitry is employed in combination with the ideality factor extraction circuitry 200. Essentially, the converter circuitry receives an extraction signal from a generation circuit, such as the ideality factor extraction unit 212. Referring to FIGS. 4 and 6 of the drawings, the reference numeral 400 and 600 generally designate converter circuitry and its operation. The converter circuitry 400 comprises a voltage divider 402, muxes 404 and 406, and a decoder 407.

The voltage divider 402 comprises a first resistor 414, with a value of $R_1$, a second resistor 416, with a value of $R_1$, and a third resistor 418, with a value of $R_r$. Typically, sixteen resistors are employed within the voltage divider, but three are show for the purposes of illustration. However, there can be as many resistors as desired depending on the use. Also, the resistors can be scaled up or scaled down for power control and other purposes.

A voltage from the voltage divider 402 is then selected and measured. Voltages from the voltage divider 402 are transmitted to the mux 404 through communication channels 444, 446, and 448; however, there are as many communication channels as voltage division in the voltage divider. The specific voltage from the voltages 402 that is output by the mux 404 is selected by a selection signal. A selection signal is generated in step 602 provided through a communication channel 411 by the mux 406 to the decoder 407. The decoder 407 then provides a decoded selection signal to the mux 404 through the communication channel 412 in step 604. The mux 404 then outputs a voltage, after selection, through a communication channel 414 in step 606. Then, the supply voltage ($V_R$) divided by the output voltage from the communication channel 414 ($V_M$) is the ideality factor, computed in step 608.

The operation of mux 406 is to provide the correct selection for conversion of a final selection signal to a voltage. The mux 406 receives settings through a communication channel 408. The mux 406 also receives a location select signal through a communication channel 410 that allows the mux 406 to select between the various diodes. Hence, based on the location select signal, the ideality factors of the various diodes on a wafer can be measured.

Figure 5:
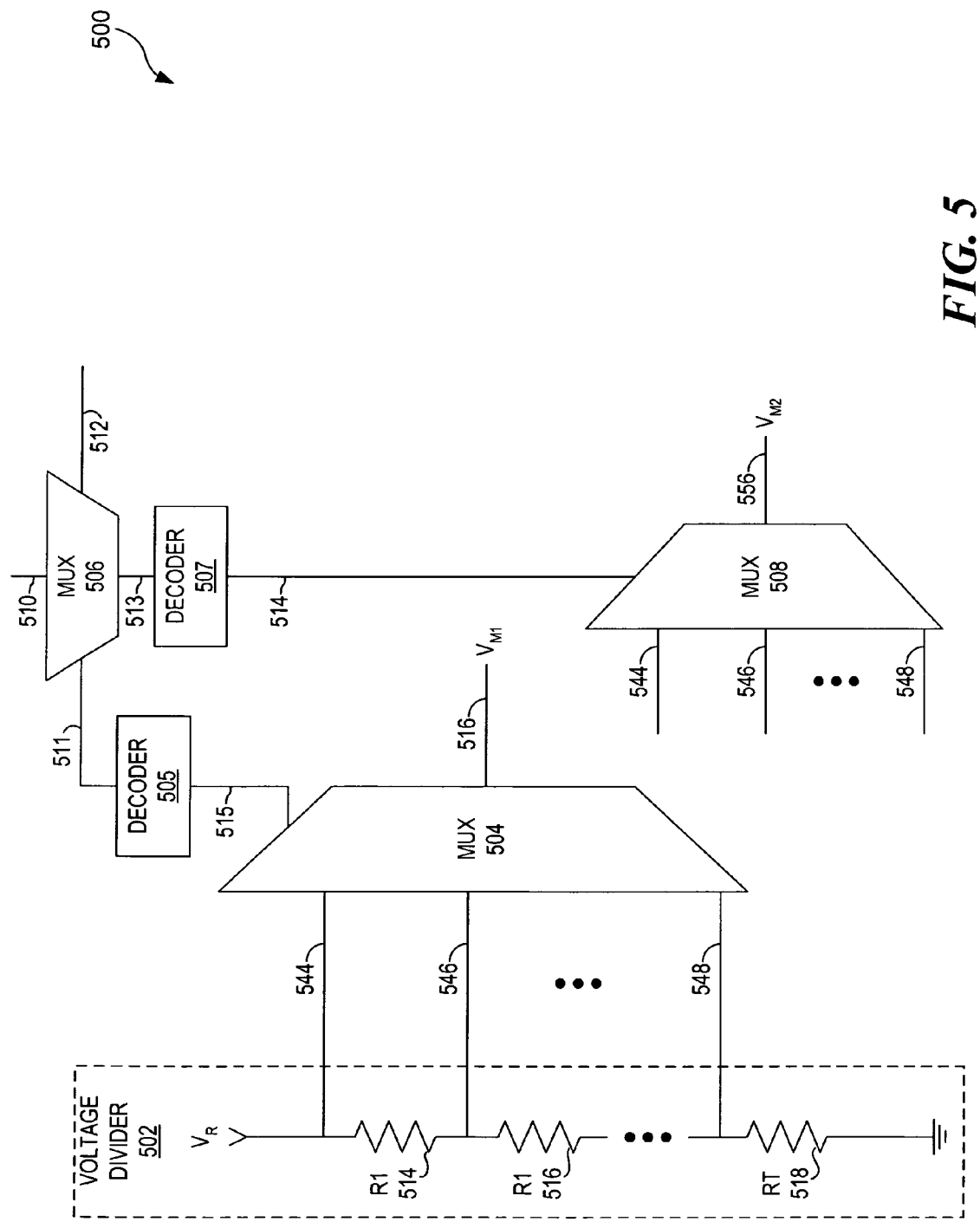
FIG. 5 is a block diagram depicting an alternative converter circuit.

Additionally, multiple computations can be done at the same time. Referring to FIGS. 5 and 6 of the drawings, the reference numeral 500 and 600 generally designate converter circuitry and its operation. The converter circuitry 500 comprises a voltage divider 502, a muxes 504, 506, and 508, and decoders 505 and 507.

The voltage divider 502 comprises a first resistor 514, with a value of $R_1$, a second resistor 516, with a value of $R_1$, and a third resistor 518, with a value of $R_r$. Typically, sixteen resistors are employed within the voltage divider, but three are shown for the purposes of illustration. However, there can be as many resistors as desired depending on the use. Also, the resistors can be scaled up or scaled down for power control and other purposes.

A voltage from the voltage divider 502 is then selected and measured. Voltages from the voltage divider 502 are transmitted to the mux 504 through communication channels 544, 546, and 548; however, there are as many communication channels as voltage division in the voltage divider. The specific voltage from the voltages 502 that is output by the mux 504 is selected by a selection signal. A selection signal is generated in step 602 provided through a communication channel 511 by the mux 506 to the decoder 505. The decoder 505 then provides a decoded selection signal to the mux 504 through the communication channel 515 in step 604. The mux 504 then outputs a voltage, after selection, through a communication channel 516 in step 606. Then, the supply voltage ($V_R$) divided by the output voltage from the communication channel 516 ($V_{M1}$) is the ideality factor, computed in step 608.

The operation of second mux 506, however, is to provide the correct selection signal for conversion of a final selection to a voltage. The second mux 506 receives decoder settings through a sixth communication channel 510. The second mux 506 also receives a location select signal through a seventh communication channel 512 that allows the decoder to select between the various diodes.

In addition to providing a selection signal for the first mux 504, the mux 508 can be added to the loop. Voltages from the voltage divider 502 are transmitted to the mux 508 through communication channels 544, 546, and 548; however, there are as many communication channels as voltage division in the voltage divider. The specific voltage from the voltages 502 that is output by the mux 508 is selected by a selection signal. A selection signal is generated in step 602 provided through a communication channel 513 by the mux 506 to the decoder 507. The decoder 507 then provides a decoded selection signal to the mux 508 through the communication channel 514 in step 604. The mux 508 then outputs a voltage, after selection, through a communication channel 556 in step 606. Then, the supply voltage ($V_R$) divided by the output voltage from the communication channel 556 ($V_{M2}$) is the ideality factor, computed in step 608.

By utilizing an semi-automated system, ideality factors can be easily determined. Without having to employ previous, and manually intensive, methodologies, quality assurance of semiconductor devices can be greatly improved. The overall efficiency of manufacturing semiconductor devices can be increased by eliminating the previously intensive processes to determine ideality factors of diodes. Therefore, cost can be reduced while increasing the rate of manufacture.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. An apparatus for semi-automatic extraction and monitoring of diode ideality in a manufacturing environment, comprising:
   a PTAT circuit means for generating a thermal voltage output proportional to temperature (PTAT);
   a clock control block means;
   an extraction control unit means driven by the control block means and having an extraction control output;
   a multiplexer (mux) for receiving the thermal voltage output and a signal corresponding to said extraction control output;
   a comparator for receiving an output from the mux and an ideal PTAT value, and further having a comparator output; and
   a serial shift register interconnected to the comparator output.

2. The apparatus of claim 1, wherein the PTAT circuit means further comprises a voltage divider to generate a plurality of thermal voltage outputs.

3. The apparatus of claim 2, wherein mux receives the plurality of thermal voltages from the voltage divider.

4. The apparatus of claim 1, wherein the apparatus further comprises:
   a Leading Zero Detector (LZD) for determining a leading zero location stored within the serial shift register; and
   a storage register to store the leading zero location.

5. The apparatus of claim 4, wherein the apparatus further comprises a conversion circuit for converting the leading zero location to a voltage.

6. The apparatus of claim 5, wherein the conversions circuit further comprises:
   a first mux for receiving decoder information and location information to provide a location selection output; and
   at least one second mux for receiving the location selection output to provide a voltage output.

7. A method for semi-automatic extraction and monitoring of diode ideality in a manufacturing environment, comprising:
   generating a thermal voltage output proportional to temperature (PTAT);
   providing an extraction control output driven by a control block means;
   receiving the thermal voltage output at a mux;
   providing a signal corresponding to said extraction control output by the mux;
   comparing an output from the mux and an ideal PTAT value; and
   storing a compared output of the mux and the ideal PTAT value in a serial shift register.

8. The method of claim 7, wherein the step of generating the thermal voltage output further comprises generating a plurality of thermal voltage outputs.

9. The method of claim 7, wherein the method further comprises:
   determining a leading zero location stored within the serial shift register; and
   storing the leading zero location.

10. The method of claim 9, wherein the method further comprises converting the leading zero location to a voltage.

11. The method of claim 9, wherein the step of converting further comprises:
    receiving decoder information and location information to provide a location selection output by a first mux; and
    receiving the location selection output to provide a voltage output by at least one second mux.

12. A computer program product for semi-automatic extraction and monitoring of diode ideality in a manufacturing environment, the computer program product having a computer readable medium with a computer program embodied thereon, the computer program comprising:
    computer code for generating a thermal voltage output proportional to temperature (PTAT);
    computer code for providing an extraction control output driven by a control block means;
    computer code for receiving the thermal voltage output at a mux;
    computer code for providing a signal corresponding to said extraction control output by the mux;
    computer code for comparing an output from the mux and an ideal PTAT value; and
    computer code for storing a compared output of the mux and the ideal PTAT value in a serial shift register.

13. The computer program product of claim 12, wherein the computer code for generating the thermal voltage output further comprises computer code for generating a plurality of thermal voltage outputs.

14. The computer program product of claim 12, wherein the computer program product further comprises:
    computer code for determining a leading zero location stored within the serial shift register; and
    computer code for storing the leading zero location.

15. The computer program product of claim 14, wherein the computer program product further comprises computer code for converting the leading zero location to a voltage.

16. The computer program product of claim 14, wherein the computer code for converting further comprises:

computer code for receiving decoder information and location information to provide a location selection output by a first mux; and computer code for receiving the location selection output to provide a voltage output by at least one second mux.

17. A processor for semi-automatic extraction and monitoring of diode ideality in a manufacturing environment, the processor including a computer program embedded in a computer readable medium comprising:

computer code for generating a thermal voltage output proportional to temperature (PTAT);

computer code for providing an extraction control output driven by a control block means;

computer code for receiving the thermal voltage output at a mux;

computer code for providing a signal corresponding to said extraction control output by the mux;

computer code for comparing an output from the mux and an ideal PTAT value; and computer code for storing a compared output of the mux and the ideal PTAT value in a serial shift register.

18. The computer code of claim 17, wherein the computer code for generating the thermal voltage output further comprises computer code for generating a plurality of thermal voltage outputs.

19. The computer code of claim 17, wherein the computer program product further comprises:

computer code for determining a leading zero location stored within the serial shift register; and computer code for storing the leading zero location.

20. The computer code of claim 19, wherein the computer program product further comprises computer code for converting the leading zero location to a voltage.

21. The computer code of claim 19, wherein the computer code for converting further comprises:

computer code for receiving decoder information and location information to provide a location selection output by a first mux; and computer code for receiving the location selection output to provide a voltage output by at least one second mux.

* * * * *